United States Patent
Song

(10) Patent No.: US 11,862,227 B2
(45) Date of Patent: Jan. 2, 2024

(54) MEMORY CELL DRIVER CIRCUIT

(71) Applicant: SEMIBRAIN INC., Seongnam-si (KR)

(72) Inventor: Seung-Hwan Song, Palo Alto, CA (US)

(73) Assignee: SEMIBRAIN INC., Seongnam-si (KR)

( * ) Notice: Subject to any disclaimer, the term of this patent is extended or adjusted under 35 U.S.C. 154(b) by 171 days.

(21) Appl. No.: 17/526,567

(22) Filed: Nov. 15, 2021

(65) Prior Publication Data

US 2023/0154523 A1    May 18, 2023

(51) Int. Cl.
| | | |
|---|---|---|
| G11C 11/40 | (2006.01) | |
| G11C 11/4074 | (2006.01) | |
| G11C 5/14 | (2006.01) | |
| G11C 11/4096 | (2006.01) | |
| G11C 11/4099 | (2006.01) | |

(52) U.S. Cl.
CPC ............ *G11C 11/4074* (2013.01); *G11C 5/14* (2013.01); *G11C 11/4096* (2013.01); *G11C 11/4099* (2013.01)

(58) Field of Classification Search
CPC ... G11C 11/4074; G11C 5/14; G11C 11/4096; G11C 11/4099
See application file for complete search history.

(56) References Cited

U.S. PATENT DOCUMENTS

| | | | | |
|---|---|---|---|---|
| 5,991,221 A | * | 11/1999 | Ishikawa | G11C 5/145 365/189.09 |
| 9,865,354 B1 | * | 1/2018 | Song | G11C 11/5628 |
| 10,826,473 B2 | * | 11/2020 | Liu | H03K 5/133 |
| 2006/0044924 A1 | * | 3/2006 | Wada | G11C 11/4074 365/230.06 |
| 2021/0090633 A1 | * | 3/2021 | Ito | G11C 16/0483 |

* cited by examiner

*Primary Examiner* — Tuan T Nguyen

(57) ABSTRACT

A driver circuit for operating a memory cell, adapted to be coupled to at least one memory cell through a respective output node, said driver circuit including: a first circuit for supplying the memory cell with a first read reference voltage through the output node; a second circuit for supplying the memory cell with a second read reference voltage through the output node; and a third circuit for controlling an operation of the second circuit, wherein a range of the second read reference voltage at the output node is wider than a range of the first read reference voltage at the output node during a read operation on the memory cell.

18 Claims, 7 Drawing Sheets

MEMORY CELL DRIVER CIRCUIT

TECHNICAL FIELD OF THE INVENTION

The present invention relates to a driver circuit for operating memory cells, in particular for reading, programming, and erasing memory cells for semiconductor memory devices, such as non-volatile memories.

BACKGROUND OF THE INVENTION

Memory circuits commonly use an external voltage source. However, the memory cell requires various voltages other than the external voltage in certain circumstances. The memory circuit internally generates a voltage higher than the external voltage for programming or erasing stored information in the memory cells to meet such voltage needs.

Specifically, various voltages in embedded flash memory circuits are applied to the memory cell through word lines for the program, read, and erase operations. A high-level voltage is applied to the memory cells for programming or erasing purposes, and a low-level voltage is applied to read the memory cells. Generally, a high programming voltage equivalent to the three to four times a standard power supply voltage (i.e., 7.5V~10 V) is used. The supply of the high voltage to the memory cells requires the switching operation of a set of PMOS transistors. On the other hand, the supplying of the low reading voltages has been implemented through a switching operation of the NMOS transistors.

However, driving the low voltage with NMOS transistors to read the memory cell has a technical limit. The NMOS transistors lack the capacity for driving sufficient ranges of the voltages to determine if the sensed memory cell is programmed. Therefore, the reference voltage brought by the NMOS transistors tends to fail to reach a targeted supply voltage level (VDD) for accurate verification of the memory cell. Rather, a voltage level lower than the VDD voltage, a voltage equivalent to the VDD voltage minus a threshold voltage of the NMOS transistor, had to be applied to the memory cell. Thus, applying the broad range of voltages for an accurate reading of the memory cell is challenging.

In view of the state of the art outlined in the foregoing, the problem that the Applicant has faced has been how to supply the targeted level of the reference voltage to the memory cell to read.

SUMMARY OF THE INVENTION

According to an aspect of the present invention, a driver circuit for operating a memory cell adapted to be coupled to at least one memory cell through a respective output node, the driver circuit including: a first circuit for supplying the memory cell with a first read reference voltage through the output node; a second circuit for supplying the memory cell with a second read reference voltage through the output node; and a third circuit for controlling an operation of the second circuit, wherein a range of the second read reference voltage at the output node is wider than a range of the first read reference voltage at the output node during a read operation on the memory cell.

According to another aspect of the present invention, the first circuit includes stacked PMOS transistors and stacked NMOS transistors in series in which a common region of a pair of the PMOS and NMOS transistors is connected to the output node coupled to the memory cell; the PMOS transistors are adapted to provide a high voltage charging path between one of connected voltage supply nodes and the output node for programming or erasing the memory cell; and the NMOS transistors are adapted to provide a high voltage discharging path between the output node and one of the connected voltage supply nodes.

According to another aspect of the present invention, the NMOS transistors are adapted to provide a low voltage discharging path between the output node and the one of the connected voltage supply nodes.

According to another aspect of the present invention, the NMOS transistors further include a pair of NMOS transistors in parallel connected to respective voltage supply nodes.

According to another aspect of the present invention, one of the pair of NMOS transistors is adapted to be activated for charging the output node to a low-level voltage during the read operation of the memory cell and the other one of the pair of NMOS transistors is adapted to be activated for discharging the output node to a ground potential.

According to another aspect of the present invention, the second circuit includes a plurality of PMOS transistors stacked in series between a connected voltage supply node and the output node, each having a gate terminal coupled to a respective gate control node connected to the third circuit.

According to another aspect of the present invention, the second voltage at the output node is between a ground potential and a supply voltage at the voltage supply node coupled to the second circuit.

According to another aspect of the present invention, the third circuit includes one or more transistors for applying gate control signals to the PMOS transistors in the second circuit based on an external input signal received.

According to another aspect of the present invention, a level of the supply voltage at the voltage supply node is a nominal tolerable voltage stress level of the PMOS transistors based on an external input signal received.

According to another aspect of the present invention, the third circuit sets the gate control voltages for the plurality of PMOS transistors at a ground potential to deliver the second voltage to the output node during the read operation on the memory cell.

According to another aspect of the present invention, the third circuit is adapted to apply predefined different gate control voltages to deactivate the respective PMOS transistors when the output node is being charged to the high-level voltage through the first circuit.

According to another aspect of the present invention, the third circuit is adapted to apply a gate control voltage identical to the high-level voltage at the output node to the PMOS transistor adjacent to the output node when the output node is being charged to the high-level voltage through the first circuit.

According to another aspect of the present invention, the third circuit is adapted to apply the gate control voltages to the respective PMOS transistors, wherein the gate control voltages decrease in magnitude from the high-level voltage by a ratio defined by a number of the PMOS transistors.

According to another aspect of the present invention, the third circuit is adapted to selectively deactivate the PMOS transistors when the output node is being discharged to a ground level through the stacked NMOS transistors in the first circuit.

According to still another aspect of the present invention, an information processing system that includes at least one memory device, the memory devices including a driver circuit for driving a memory cell, the driver circuit including: a first circuit for charging the memory cell to a first voltage through a connected output node by applying one of voltages from voltage supply nodes connected; a second circuit for charging the memory cell to a second voltage through the output node by applying a voltage from a voltage supply node connected; and a third circuit for controlling an operation of the second circuit, wherein a range of the second voltage at the output node is greater than a range of the first voltage at the output node during a read operation on the memory cell.

BRIEF DESCRIPTION OF THE DRAWINGS

Features of the present invention will become apparent to those skilled in the art from the following description regarding the drawings. Understanding that the drawings depict only typical embodiments of the invention and are not, therefore, to be considered limiting in scope, the invention will be described with additional specificity and detail through the use of the accompanying drawings, in which.

DETAILED DESCRIPTION OF PREFERRED EMBODIMENTS

Preferred embodiments of the present invention will be described in detail hereinbelow with reference to the attached drawings.

Figure 1:
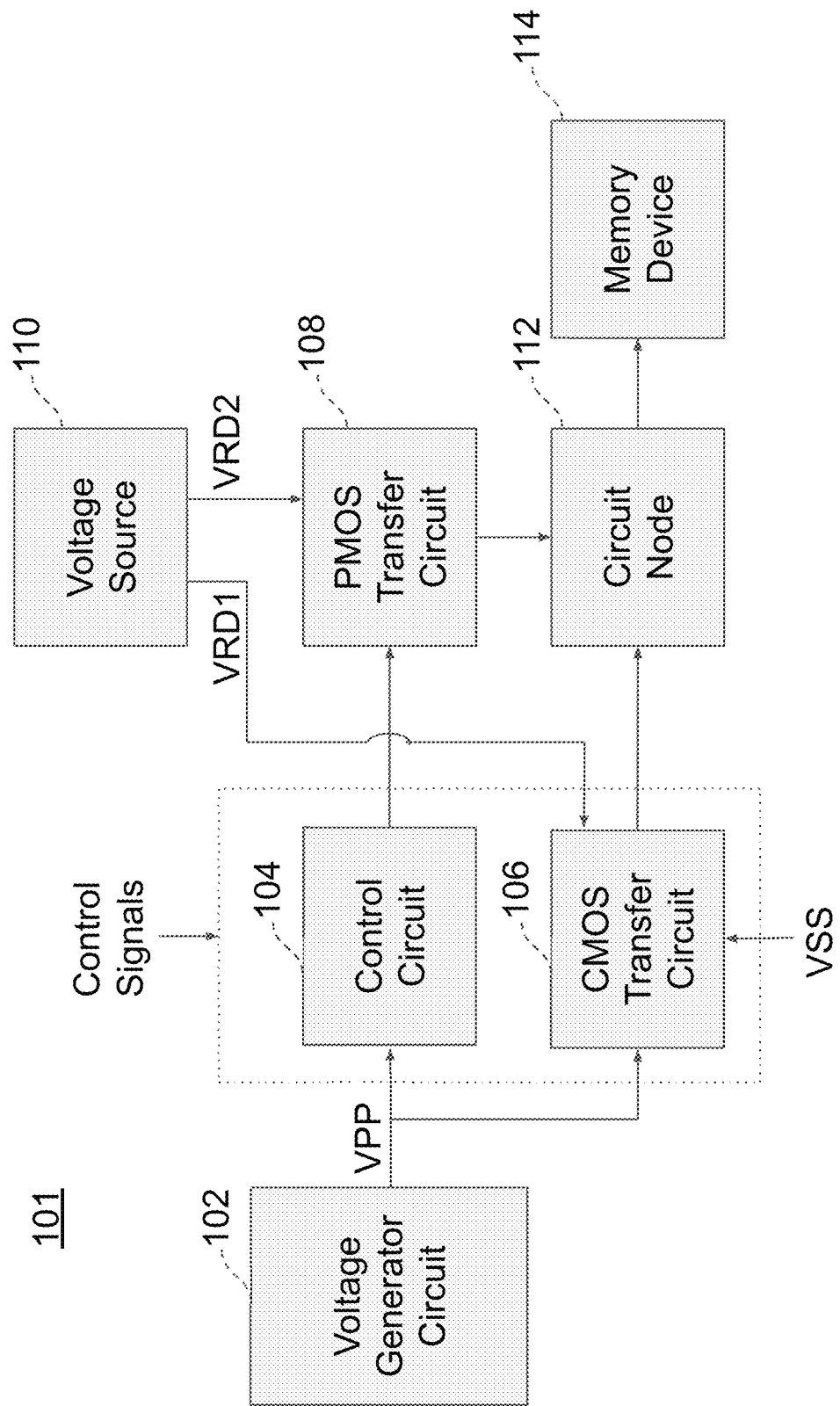
FIG. 1 is a functional block of a driver circuit according to the present invention.

FIG. 1 shows a block diagram of a driver circuit including a pair of voltage supply circuits for programming, reading, or erasing operation of memory devices.

The driver circuit 101, for example, includes a circuit node 112 that is connected to a respective word line of a memory device 114 including one or more memory cell arrays (not shown). A memory cell in the memory device 114 can be programmed by injecting electrical charge into its floating gate to increase the cell threshold voltage therefore.

A voltage generator 102, for example, includes a voltage pump (not shown) for generating and transmitting various high voltage levels to both a control circuit 104 and a CMOS transfer circuit 106 via a voltage node VPP connected. For programming, erasing, or reading the memory cell, the voltage generator 102 generates a voltage ranging between ground potential and a high voltage value defined as approximately a voltage potential equal to a supply voltage (VDD) multiplied by various ratios, e.g., four times VDD voltage. The value of the ratios is set based on the use of circuit node 112 in response to the different operations on the memory cell as described in FIGS. 3 to 6.

In an exemplary but not-limitative embodiment of the present invention, the control circuit 104 includes at least one transistor and is adapted to operate the PMOS transfer circuit 108 to drive the circuit node. The control circuit 104 is also adapted to apply different control signals to the PMOS transfer circuit 108 to reduce expected voltage stress on the PMOS transfer circuit 108 during the programming or erasing operation. The control circuit 104 can be further adapted to selectively operate transistors in the PMOS transfer circuit 108 to prevent an electrical leakage from the circuit node 112 when the circuit node 112 is discharged to a ground potential level.

The CMOS transfer circuit 106 includes a plurality of PMOS and NMOS transistors and charges the memory device 114 to the high voltage via the circuit node 112 upon receiving the high voltage from the voltage generator 102 for programming or erasing the memory cell. The CMOS transfer circuit 106 is further adapted to discharge the memory cell to a potential ground level for idle operation. For reading the memory cell, the CMOS transfer circuit 106 is adapted to apply a voltage to the circuit node 112 based on a voltage at a VRD1 node generated by a voltage source 110.

In an exemplary but not-limitative embodiment of the present invention, PMOS transfer circuit 108 includes a plurality of PMOS transistors to drive the circuit node. Upon receiving control signals of the control circuit 104, the PMOS transfer circuit 108 applies a read reference voltage to the circuit node 112 to determine whether the memory cell is in a programmed state or not (erased).

A voltage source 110 is configured to generate various voltage levels between a ground potential and a standard supply voltage VDD (e.g., 2.5 volts). The voltage source 110 supplies the same or different voltages to the CMOS transfer circuit 106 and the PMOS transfer circuit 108 via VRD1 and VRD2 nodes, respectively.

For the operations of the memory cell, the circuit node 112 transmits voltages generated by the CMOS transfer circuit 106 and/or the PMOS transfer circuit 108 to the memory cell. For example, the circuit node 112 receives currents from the activated CMOS transfer circuit 106 and currents from the activated PMOS transfer circuit 108. Thus, a voltage at the circuit node 112 is responsive to the currents received.

Figure 7B:
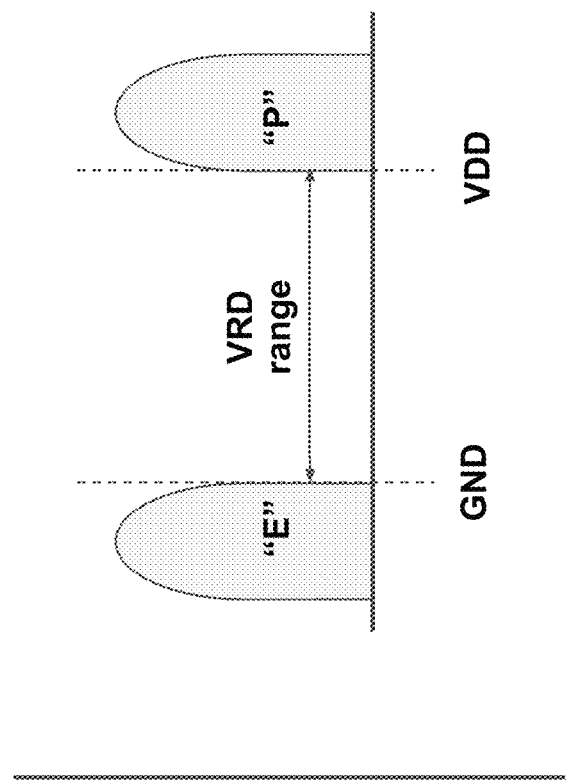
FIGS. 7A and 7B are graphical diagrams illustrating distribution profiles of resulting cell threshold voltages of the embedded flash memory device without and with the present invention, respectively.
Figure 7A:
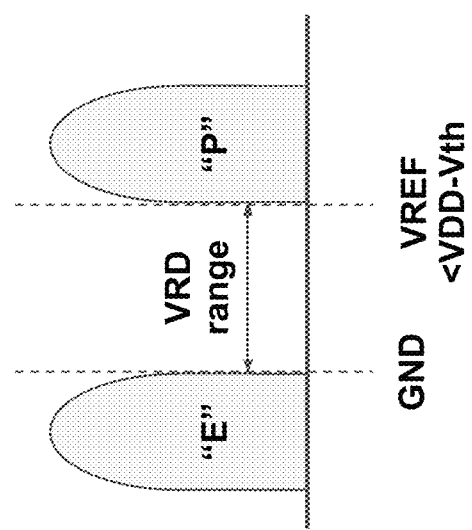

The memory device 114 is adapted to include the memory cell array in which the memory cells are connected to respective circuit nodes 112. Each of the memory cells has a programmed threshold voltage range and an erased voltage range, as shown in FIGS. 7A and 7B.

Circuits and methods for implementing charge and discharge the circuit node 112 are described in reference to FIGS. 2-6. The circuits and methods set forth in more detail may be implemented within a single integrated circuit die or may be implemented in a multiple-chip module.

Figure 2:
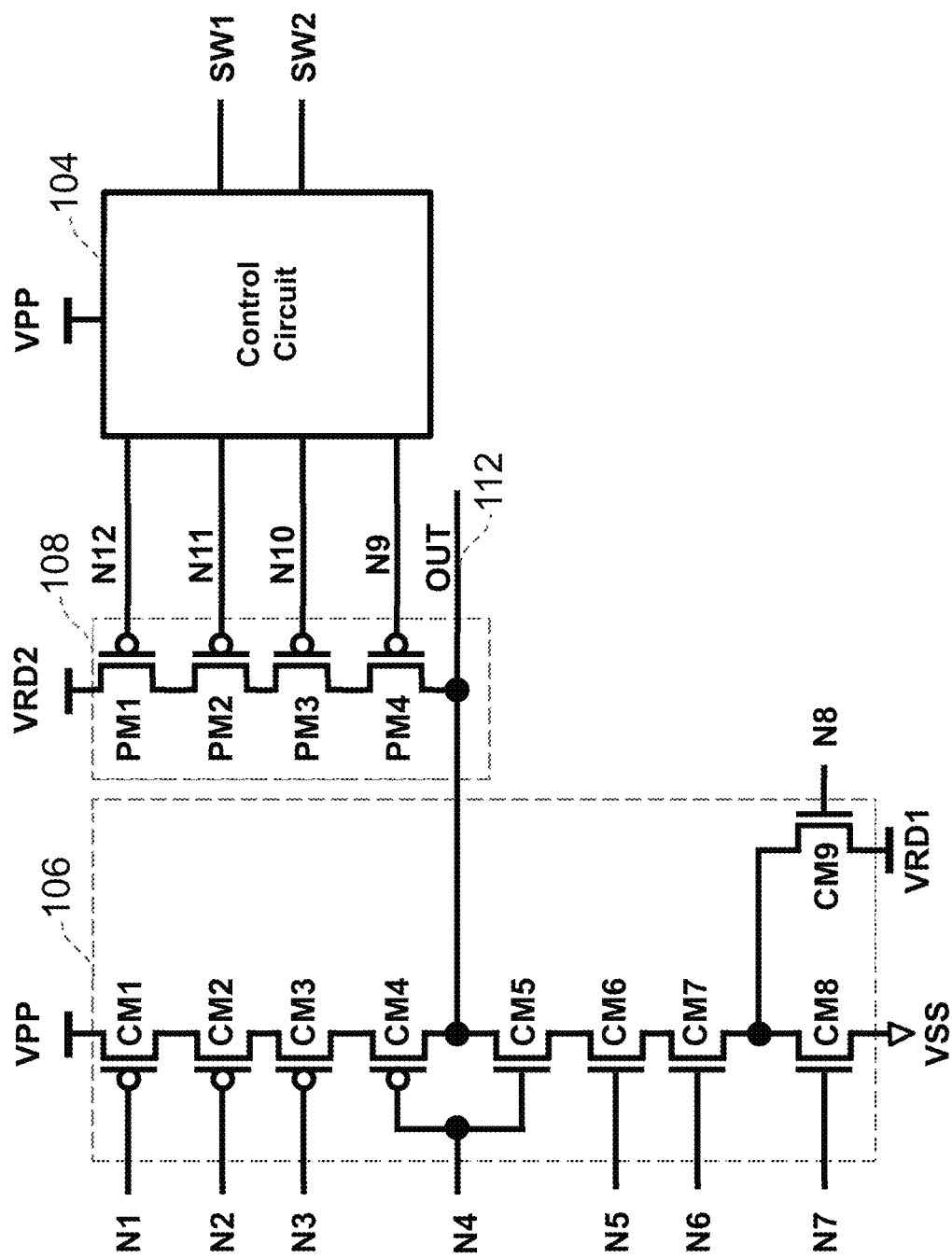
FIG. 2 is a schematic form of the driver circuit of FIG. 1 according to a preferred embodiment of the present invention.

FIG. 2 is a schematic form of the driver circuit of FIG. 1 according to a preferred embodiment of the present invention.

In an exemplary but non-limitative embodiment of the present invention, the CMOS transfer circuit 106 includes nine stacked P and N-type metal oxide semiconductor transistors. In the CMOS transfer circuit 106, the four P-type metal oxide semiconductor (PMOS) transistors CM1, CM2, CM3 and CM4 are arranged to connect the voltage node VPP to the circuit node 112.

The CM1, CM2, CM3 and CM4 are adapted to receive gate signals through their gate terminals coupled to the nodes N1, N2, N3 and N4, respectively.

The CM1 has a source coupled to the VPP node having a voltage ranging from the VDD voltage to a voltage of four times the VDD voltage, a drain coupled to a source of the CM2, and the gate coupled to a node N1 to provide a current path through CM1. The CM2 has a source connected to the drain of the CM1, a drain coupled to a source of the transistor CM3, and a gate coupled to a node N2 to provide a current path between the CM1 and CM3. The CM3 has a source connected to the drain of the CM2, a drain coupled to a source of the transistor CM4, and a gate coupled to a node N3 to provide a current path between the CM2 and CM4. The CM4 has a source connected to the drain of the CM3, a gate coupled to a node N4 to provide a current path through the transistor CM4, and a drain coupled to the circuit node 112.

In the CMOS transfer circuit 106, the five N-type metal oxide semiconductor (NMOS) transistors CM5, CM6, CM7, CM8 and CM9 are arranged to connect the circuit node 112 to either a ground node VSS and the VRD1 node.

The CM5 has a drain connected to both the drain of the CM4 and the circuit node 112, a source coupled to a drain of the CM6, and a gate coupled to the node N4 to provide a charge path through the CM5, The CM6 has a drain coupled to the source of the CM5, a source coupled to a drain of the CM7, and a gate coupled to a node N5 to provide a charge path through the CM6. The CM7 has a drain coupled to the source of the CM6, a source coupled to the drains of the CM8 and CM9, and a gate coupled to a node N6 to provide a charge path through the CM7. The CM8 has a drain coupled to the source of the CM7, a source coupled to the ground node VSS, and a gate coupled to a node N7 to provide a charge path through the CM8. The CM9 has the drain coupled to the source of the CM7, a source coupled to the VRD1 node that can have a voltage level between ground and the supply voltage VDD, and a gate coupled to a gate node N8 to provide a charge path through the CM9.

The PMOS transfer circuit 108 is arranged between the VRD2 node and the circuit node 112. The VRD2 node can have a voltage level between ground and the standard supply voltage VDD (e.g., 2.5 volts). The VRD1 node coupled to the CMOS transfer circuit 106 and the VRD2 node coupled to the PMOS transfer circuit 108 can have the same or different voltage.

In one embodiment, PMOS transfer circuit 108 includes four stacked PMOS transistors PM1, PM2, PM3 and PM4.

The PM1 has a source coupled to the VRD2 node, a drain coupled to a source of the PM2, and a gate coupled to a node N12 to provide a charge path through the PM1. The PM2 between the PM1 and PM3 has a source connected to a drain of the PM1, a drain connected to a source of the PM3, and a gate coupled to a node N11 to provide a charge path through the PM2. The PM3 between the PM2 and PM4 has a source connected to a drain of the PM2, a drain connected to a source of the PM4, and a gate coupled to a node N10 to provide a charge path through the PM3. The PM4 between the PM3 and the circuit node112 has a source connected to a drain of the PM3, a drain connected to the circuit node 112, and a gate coupled to a node N9 to provide a charge path through the PM4.

In one embodiment, when the VRD2 node has a voltage equivalent to a supply voltage VDD, the activated PM1, PM2, PM3 and PM4 allow charge flows from the VRD2 node to the circuit node 112 that is set be charged up to a level predefined. The results of the activation or deactivation of the PM1, PM2, PM3 and PM4 in providing the charge path are described in detail with reference to FIGS. 3-6.

The control circuit 104 is coupled to the PM1, PM2, PM3 and PM4 via the respective nodes N9, N10, N11 and N12 to transmit gate control signals based on received external input signals via SW1 and SW2. The control circuit 104 can include one or more MOS transistors for controlling the PMOS transistors based on input signals received.

Figure 3:
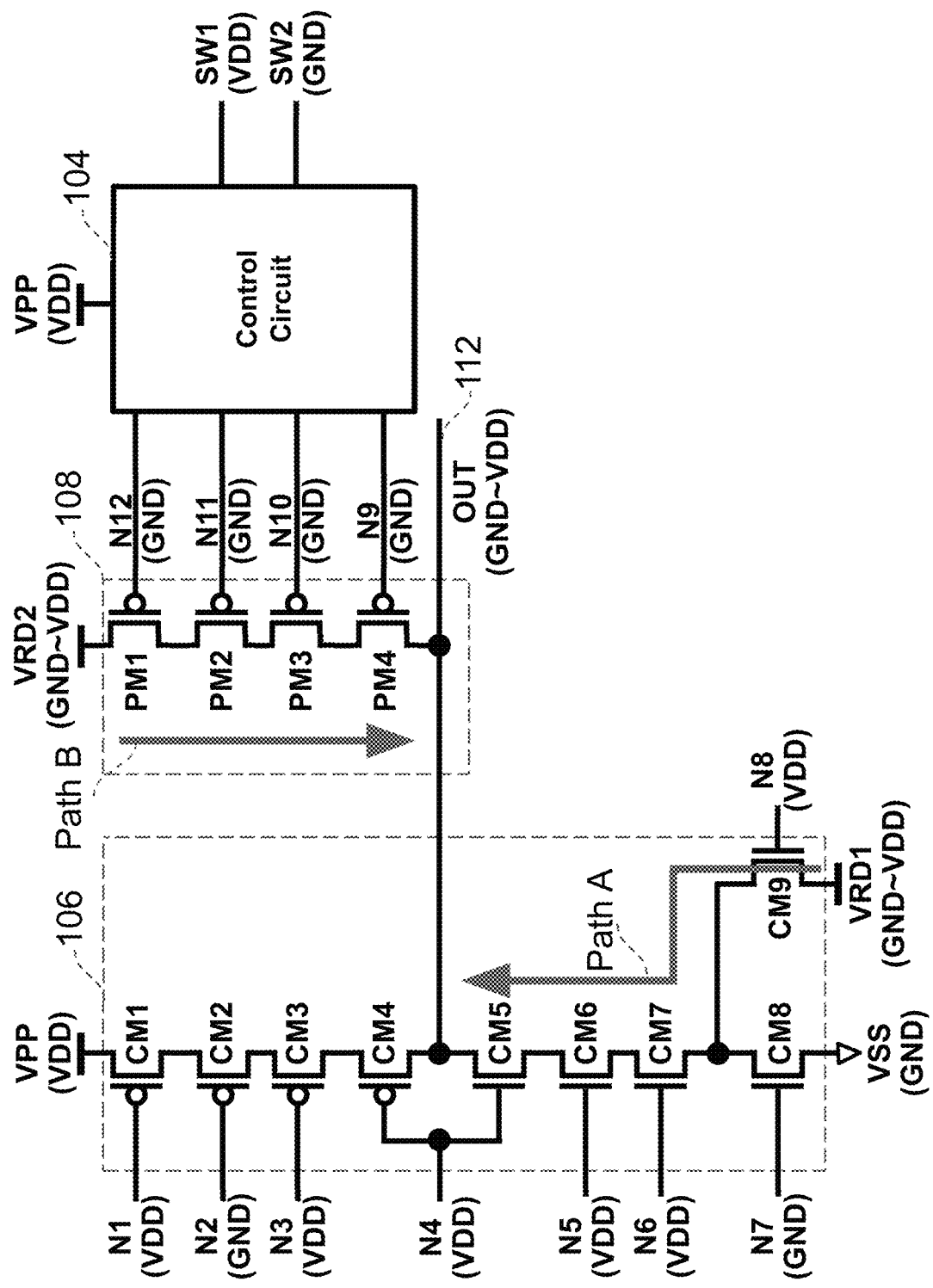
FIG. 3 shows a charging operation of the driver circuit of FIG. 1 for reading the memory cell according to one embodiment of the present invention.

FIG. 3 shows a charging operation of the driver circuit of FIG. 1 to read the memory cell according to one embodiment of the present invention. In FIG. 3, paths A and B are provided to supply a read reference voltage of which the range can be about from GND to VDD voltage to the circuit node 112. In an exemplary embodiment, during the reading operation of the memory cell, the circuit node 112 can be charged to a targeted supply voltage level VDD by the path B.

The paths A and B are effective by activation of the selected transistors in the CMOS and PMOS transfer circuits 106 and 108, respectively.

The path A is effective when a voltage at the VRD1 node is less than the VDD voltage minus threshold voltage that is needed to turn on the transistors CM5, CM6, CM7 and CM9 in the CMOS transfer Circuit 106. The CM5, CM6, CM7 and CM9 are activated by the VDD voltage at their gates via the coupled nodes N4, N5, N6 and N8, respectively. The path A enables the supply of current from the VRD1 node to the circuit node 112 via the activated CM5, CM6, CM7 and CM9. As a result of this current through the path A, the circuit node 112 can be charged to a voltage level of which the range is nearly from ground level (GND) to supply voltage VDD minus the threshold voltage. The deactivated CM8 prevents unwanted leakage of the charges flowing out of the path A to the ground node VSS.

The path B is effective when a voltage at the VRD2 node is greater than a threshold voltage that is needed to turn on the transistors PM1, PM2, PM3 and PM4 in the PMOS transfer circuit 108. A current flow on the PM1, PM2, PM3 and PM4 to the circuit node 112 when these transistors are activated with ground voltage (GND) on the respective gates from the control circuit 104. The control circuit 104 is coupled to the PM1, PM2, PM3 and PM4 via the respective nodes N9, N10, N11 and N12 to transmit the GND signals based on received external input signals of VDD and GND via SW1 and SW2, respectively.

As a result of this current through the path B, the circuit node 112 can be charged up to nearly the supply voltage level VDD at the VRD2 node. Therefore, a higher read reference voltage to accurately verify the programmed memory cell can be supplied to the circuit node 112 through the path B compared to when the circuit node 112 is charged by the path A alone.

In an exemplary embodiment, when the path A, path B, or the paths A and B are effective for driving the memory cell to the read reference level, no other paths are provided for charging the circuit node 112. Further, unwanted leakage current paths from the circuit node 112 are prevented. For example, a path between the VPP node to the circuit node 112 does not carry currents from the VPP node to the circuit node 112 by turning off the CM1. The CM1 is turned off by having a gate coupled to the node N1 to receive VDD and a source coupled to the VPP node to receive the VDD. The voltage at the gate of the CM2 is ground. The CM3 and CM4 are turned off by receiving the VDD through their gates such that (i) the current from the VPP node is prevented and (ii) unwanted leakage current paths from the circuit node that is charged is prevented.

Figure 4:
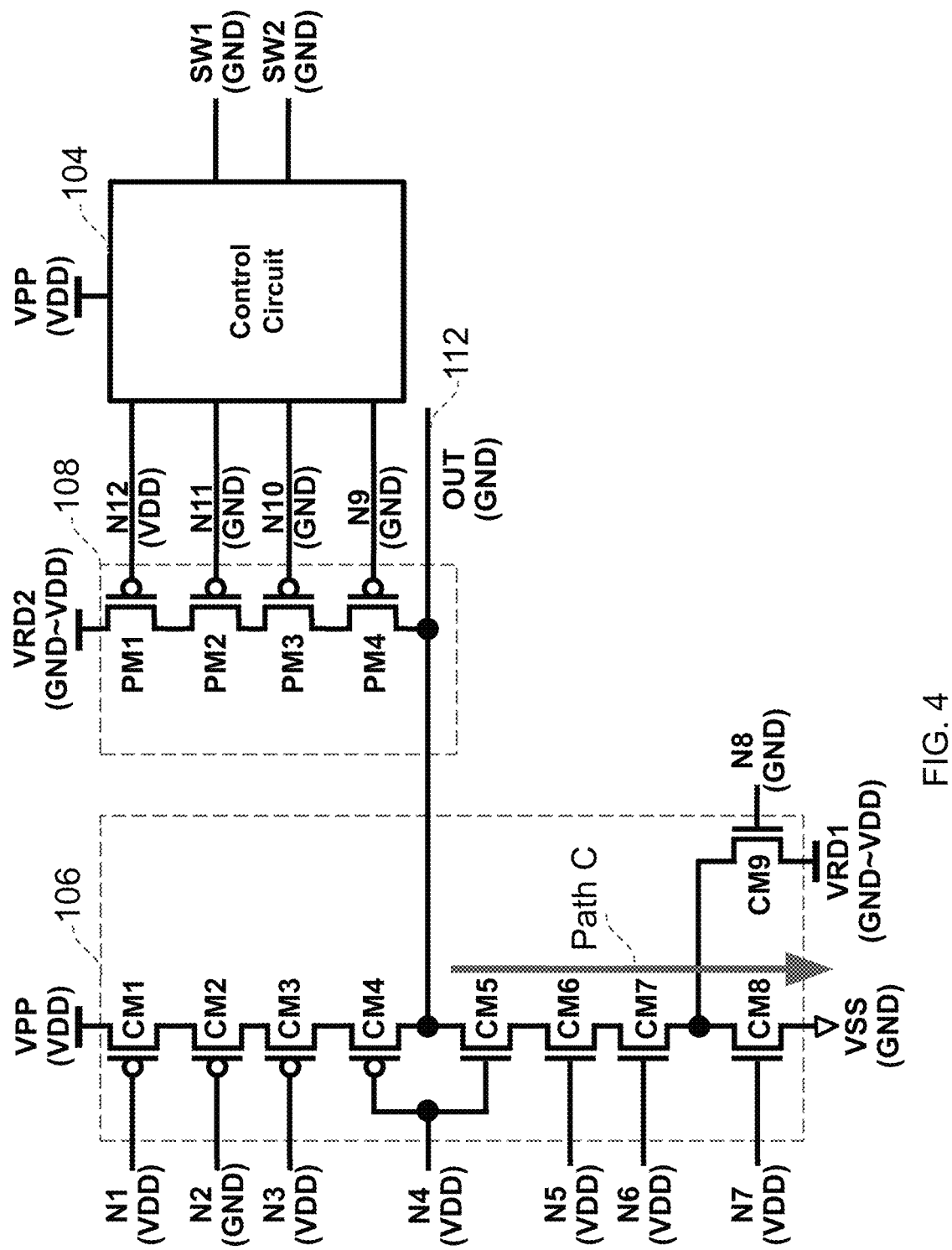
FIG. 4 shows a discharging operation of the driver circuit of FIG. 1 according to one embodiment of the present invention.

FIG. 4 shows a discharging operation of the driver circuit of FIG. 1 according to one embodiment of the present invention.

A path C is provided by the CM5, CM6, CM7 and CM8 between the circuit node 112 and the ground node VSS. The path C enables the current flow from the circuit node 112 to the VSS node when the CM5, CM6, CM7 and CM8 have a gate voltage VDD via the nodes N4, N5, N6 and N7, respectively.

When the path C is effective, no other paths are provided. A path between the circuit node 112 to the VPP node is inoperative by turning off the CM1 and CM4. The CM1, CM3 and CM4 are turned off as their gates receive the VDD voltage, rendering a magnitude of respective gate-to-source voltages less than a magnitude of the threshold voltage that is needed to turn the CM1 and CM4 on. Also, a path between the circuit node 112 and the VRD2 node is inoperative by turning off the PM1. The PM1 is turned off when its gate receives the VDD voltage from the control circuit 104, rendering a magnitude of the respective gate-source voltage less than a magnitude of the threshold voltage that is needed to turn the PM1 on.

The control circuit 104 is coupled to the PM1, PM2, PM3 and PM4 via the respective nodes N9, N10, N11 and N12 to transmit the VDD, GND, GND, GND signals based on received external input signals of GND via. SW1 and SW2. The CM9 is deactivated to prevent unwanted loss of charge from the path C when its gate terminal receives a ground voltage at the node N8. FIG. 4 is merely illustrative, and it should be noted that the selective operations of the transistors can be various to implement inoperative paths for discharging the circuit node 112 for operating the memory cells.

Figure 5:
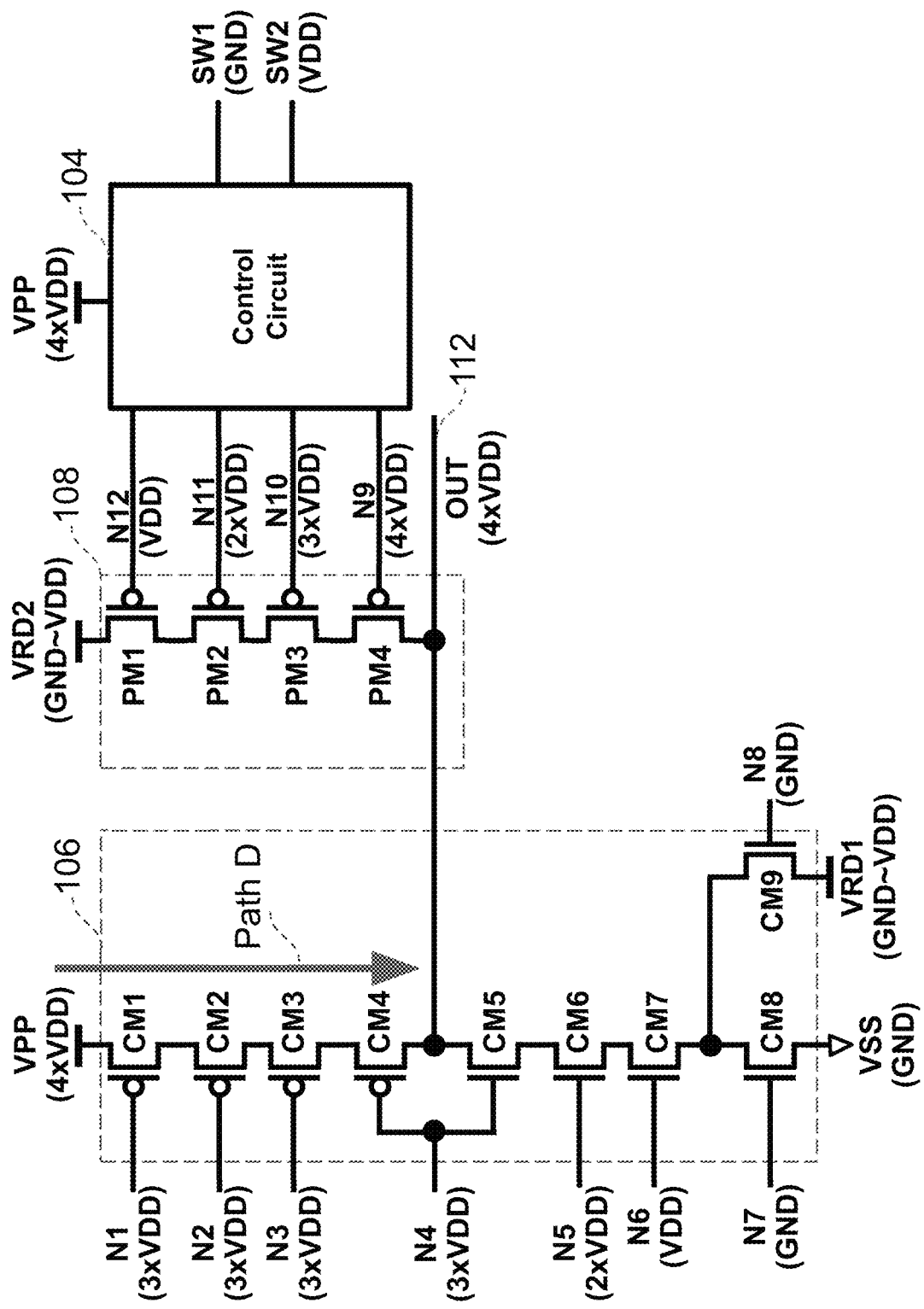
FIG. 5 shows a charging operation of the driver circuit of FIG. 1 for programming or erasing the memory cell according to one embodiment of the present invention.

FIG. 5 shows a charging operation of the driver circuit of FIG. 1 to program or erase the memory cell according to one embodiment of the present invention.

The path D between the VPP node and the circuit node 112 supplies a high voltage to the circuit node 112 to program or write data in the memory cell. The path D is effective by the activated CM1, CM2, CM3 and CM4.

Given that these transistor's voltage tolerance limit is about a VDD voltage level, a gate voltage of three times the VDD to the CM1, CM2, CM3 and CM4 reduces the voltage stress on those transistors within its nominal operating voltage of VDD (=4×VDD−3×VDD) while the path D is effective. In other words, the stacked CM1, CM2, CM3 and CM4 each can operate at its nominal voltage level of VDD (Gate-Source Voltage) for providing the path D by receiving the gate input voltage, a voltage of three times VDD, respectively.

When the path D is effective, unwanted leakage currents from the circuit node 112 are prevented. A path leading to the VRD2 node from the circuit node 112 is inoperative by turning off the PMOS transfer circuit 108.

For instance, when the path D is effective, a path through the PM4 is inoperative as the PM4's gate voltage of 4×VDD at the node N9 places a magnitude of the gate-source voltage of the PM4 not greater than a Vth (threshold voltage) of the PM4.

Also, when the path D is effective, a path through the PM3 is inoperative as the PM3's gate voltage of 3×VDD at the node N10 drives the common source/drain region between the PM3 and PM4 to about a voltage of 3×VDD plus a Vth of the PM3. This gate voltage places a magnitude of the gate-source voltage of the PM3 not being greater than the PM3 threshold voltage. Subsequently, the source/drain region's driven voltage reduces voltage stress to be applied to the drain-source of the PM4 to be not higher than about VDD level (a nominal tolerable voltage stress level).

Also, when the path D is effective, a path through the PM2 is inoperative as the PM2's gate voltage of 2×VDD at the node N11 drives the common source/drain region between the PM2 and PM3 to about a voltage of 2×VDD plus a threshold voltage Vth of the PM2. This gate voltage places a magnitude of the gate-source voltage of the PM2 not being greater than the PM2 threshold voltage. Subsequently, the source/drain region's driven voltage reduces voltage stress to be applied to a drain-source of the PM3 to be not higher than about the VDD level.

When the path D is effective, a path through the PM1 is inoperative as the PM1's gate voltage of VDD at the node N12 drives the common source/drain region between PM1 and PM2 to about VDD plus Vth of the PM1. This gate voltage places a magnitude of the gate-source voltage of the PM1 not being greater than the PM1 threshold voltage. Subsequently, the source/drain region's driven voltage reduces voltage stress to be applied to a drain-source of the PM2 to be not higher than about the VDD level.

The control circuit 104 is coupled to the PM1, PM2, PM3 and PM4 via the respective nodes N9, N10, N11 and N12 to transmit the VDD, 2×VDD, 3×VDD, 4×VDD signals based on received external input signals of GND and VDD via SW1 and SW2.

Also, when the path D is effective, a path between the circuit node 112 and the ground node VSS blocks leakage currents from the circuit node 112 by the deactivated NMOS transistors of CMOS transfer circuit.

In one embodiment, when the path D is effective, a path through the CM8 is inoperative as the CM8 has a gate-source voltage not greater than a threshold voltage of the CM8 by having a ground gate voltage through the N7.

Also, when the path D is effective, a path through the CM7 is inoperative as the CM7's gate voltage at the N6 drives the common source/drain region between CM7 and CM8 to about VDD minus Vth of the CM7. This gate voltage places a magnitude of the gate-source voltage of the CM7 not being greater than the CM7 threshold voltage. Subsequently, the source/drain region's driven voltage reduces voltage stress to be applied to a drain-source of the CM8 to be not higher than about the VDD level.

Also, when the path D is effective, a path through the CM6 is inoperative as the CM6's gate voltage at the N5 drives the common source/drain region between CM6 and CM7 to about 2×VDD minus Vth of the CM6. This gate voltage places a magnitude of the gate-source voltage of the CM6 not being greater than the CM6 threshold voltage. Subsequently, the source/drain region's driven voltage reduces voltage stress to be applied to a drain-source of the CM7 to be not higher than about the VDD level.

Also, when the path D is effective, a path through the CM5 is inoperative as the CM5's gate voltage at the N4 drives the common source/drain region between CM5 and CM6 to about 3×VDD minus Vth of the CM5. This gate voltage places a magnitude of the gate-source voltage of the CM5 not being greater than the CM5 threshold voltage. Subsequently, the source/drain region's driven voltage reduces voltage stress to be applied to a drain-source of the CM6 to be not higher than about the VDD level.

Figure 6:
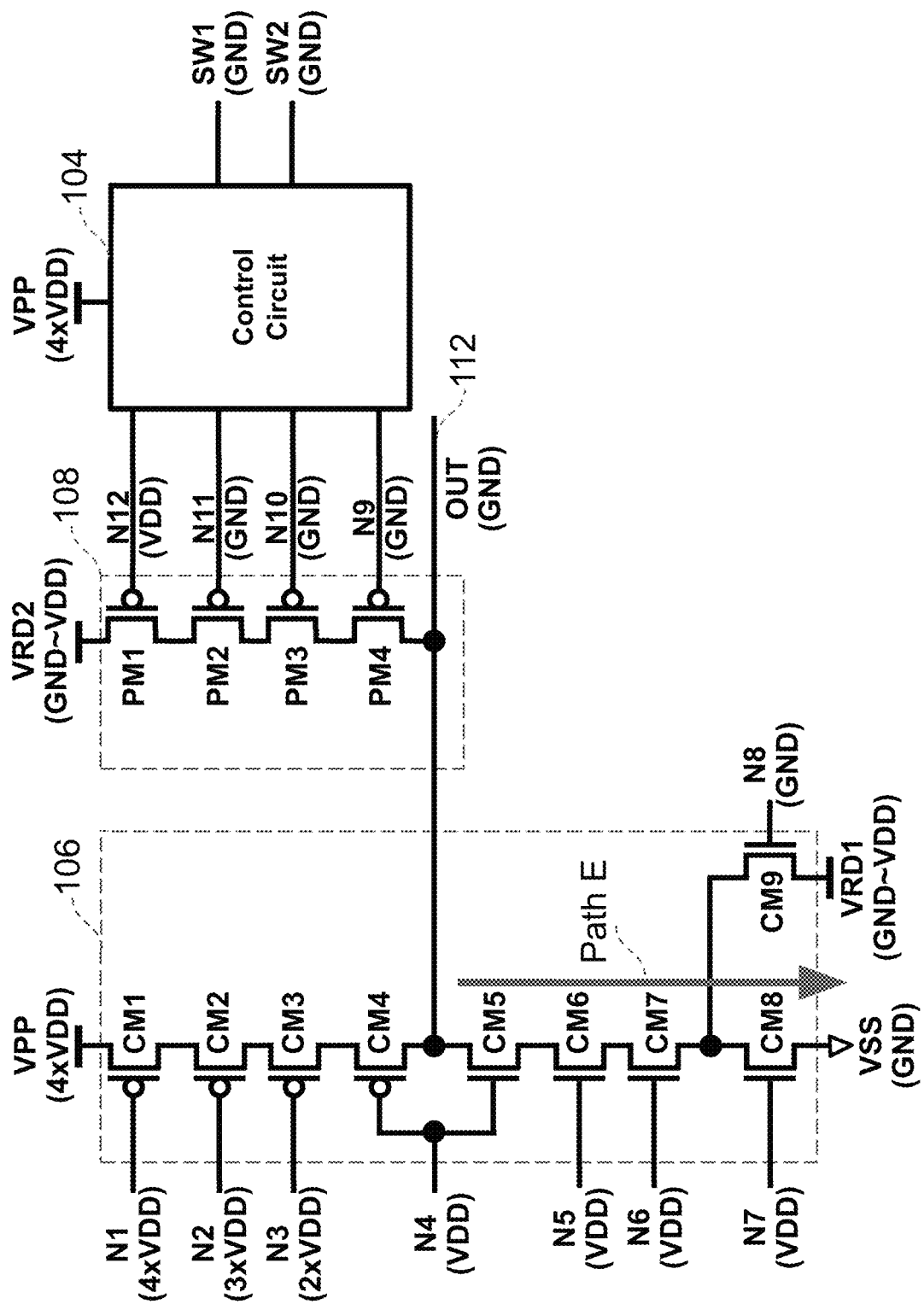
FIG. 6 shows a discharging operation of the driver circuit of FIG. 1 according to another embodiment of the present invention.

FIG. 6 shows a discharging operation of the driver circuit of FIG. 1 according to another embodiment of the present invention.

During the discharging operation, a path E between the circuit node 112 and a ground node VSS is provided by activating the CMOS transfer circuit 112. The VSS node is set to a ground voltage GND for enabling the charge flow from the circuit node 112 to the VSS when the CM5. CM6, CM7 and CM8 have the gate voltage VDD via the nodes N4, N5, N6 and N7, respectively.

When the path E is effective, no other paths are provided. A path through the CM1 is inoperative when the CM1's gate receives a high voltage 4×VDD, rendering the gate-source voltage magnitude through the coupled node N1 not higher than the threshold voltage that is needed to turn the PM1 on.

When the path E is effective, a path through the CM2 is inoperative when the CM2's gate voltage from the N2 drives the common source/drain region between CM1 and CM2 to about 3×VDD voltage plus Vth of the CM2. This gate voltage places a magnitude of the gate-source voltage of the PM2 not being greater than the threshold voltage to turn on the CM2. Subsequently, the source/drain region's driven voltage reduces voltage stress to be applied to a drain-source of the CM1 to be not higher than about VDD voltage level (a nominal tolerable voltage stress level).

When the path E is effective, a path through the CM3 is inoperative as the CM3's gate voltage from the N3 drives the common source/drain region between CM2 and CM3 to about 2×VDD plus Vth of the CM3. This gate voltage places a magnitude of the gate-source voltage of the PM3 not being greater than the threshold voltage to turn on the CM3. Subsequently, the source/drain region's driven voltage reduces voltage stress to be applied to a drain-source of the CM2 to be not higher than about the VDD level.

When the path E is effective, a path through the CM4 is inoperative as the CM4's gate voltage from the N4 drives the common source/drain region between CM3 and CM4 to about VDD plus Vth of the CM4. This gate voltage places a magnitude of the gate-source voltage of the CM4 not being greater than the threshold voltage to turn on the CM4. Subsequently, the source/drain region's driven voltage reduces voltage stress to be applied to a drain-source of the CM3 to be not higher than about the VDD level.

It also needs to be noted that the gate voltages of the cascaded PMOS transistors in the CMOS transfer circuit 106 can be reduced by a predefined ratio depending on the number of cascaded transistors coupled to a high voltage supply node. As a result, the voltage stress on each transistor CM1, CM2, CM3, and CM4 can be avoided or substantially reduced.

A path between the VRD2 node and the circuit node 112 does not carry a current from the circuit node112 by turning off the PM1. The PM1 is turned off when the PM1's gate receives the VDD voltage from the control circuit 104, placing a magnitude of the gate-source voltage through the coupled node N12 not higher than the threshold voltage that is needed to turn the PM1 on.

The unwanted leakage current from the discharging path is prevented. For instance, current leakage through the path between the circuit node 112 and the VRD2 node is prevented by turning off the PM1. The PM1 is turned off because the magnitude of the gate-source voltage of the PM1 is not higher than the threshold voltage level to turn on the PM1.

The control circuit 104 is coupled to the PM1, PM2, PM3 and PM4 via the respective nodes N9, N10, N11 and N12 to transmit the VDD, GND, GND, GND signals based on received external input signals of GND via. SW1 and SW2.

To summarize, the proposed circuits enable switching the circuit node 112 between VDD and GND during the low voltage switching mode as shown in FIGS. 3 and 4, while the circuits operate switching the circuit node 112 between 4×VDD voltage and GND addressing the high voltage stress issue stated above during the high voltage switching mode, as shown in FIGS. 5 and 6.

FIGS. 7A and 7B are graphic diagrams illustrating distribution profiles of cell threshold voltages in the embedded flash memory device.

The circuit node 112 in the proposed circuits can be connected to the embedded flash memory and provide a suitable read reference voltage (VRD1 or VRD2, collectively VRD) level to the embedded flash memory cell. The flash memory stores data in the form of a cell threshold voltage, the lowest voltage at which the flash memory cell can be switched on.

During a read operation to the cell, the cell in an "erased" state is turned on by having a cell threshold voltage less than a read reference voltage (VRD) that is applied to the output circuit node 112. In contrast, the cell in a programmed state is turned off by having a cell threshold voltage greater than the read reference voltage (VRD). Due to the process and voltage variation, memory cell threshold voltage of "E" and "P" states can have a voltage window in which the cell's threshold voltage lies.

Referring to FIG. 7A, the threshold voltage distribution "E" can span from a certain negative voltage to a minimum possible VRD to verify the cell threshold level in "E" state voltage distribution. Also, the threshold voltage distribution "P" can span from a maximum possible VRD to verify the cell threshold level in "P" state voltage distribution to a certain positive voltage. Thus, to determine with high accuracy whether the cell is erased or programmed, a large voltage gap of the cell threshold voltage between the erased and programmed states is preferred, since read reference voltage level at the middle of the gap can safely determine whether it is higher or less than the cell threshold voltage considering the wide distribution of the cell threshold voltage.

The proposed circuit in this disclosure can provide a wider range of VRD between GND and VDD voltage compared to a conventional circuit having a range of VRD between GND and VDD-Vth (transistor threshold voltage) as shown in FIG. 7A. Thus, as illustrated in FIG. 7B, a larger voltage gap of the cell threshold voltage between the erased and programmed states can be enabled, resulting in a much more reliable embedded flash memory cell connected to the proposed circuit by having a larger gap between "E" and "P" states. As a result, embedded flash memory lifetime can be extended significantly by adopting the proposed high voltage switching circuit connected to the embedded flash memory cell.

What is claimed is:

1. A driver circuit for operating a memory cell, adapted to be coupled to at least one memory cell through a respective output node, said driver circuit including:
   a first circuit for supplying the memory cell with a first read reference voltage through the output node;
   a second circuit for supplying the memory cell with a second read reference voltage through the output node; and
   a third circuit for controlling an operation of the second circuit,
   wherein a range of the second read reference voltage at the output node is wider than a range of the first read reference voltage at the output node during a read operation on the memory cell,
   wherein the second circuit includes a plurality of PMOS transistors stacked in series between a connected voltage supply node and the output node, each of said PMOS transistors having a gate terminal coupled to a gate control node connected to the third circuit.

2. The driver circuit according to the claim 1, wherein the first circuit includes stacked PMOS transistors and stacked NMOS transistors in series in which a common region of a pair of the PMOS and NMOS transistors is connected to the output node coupled to the memory cell;

wherein the PMOS transistors are adapted to provide a high voltage charging path between one of connected voltage supply nodes and the output node for programming or erasing the memory cell; and wherein the NMOS transistors are adapted to provide a high voltage discharging path between the output node and one of the connected voltage supply nodes.

3. The driver circuit according to the claim 2, wherein the NMOS transistors are adapted to provide a low voltage discharging path between the output node and the one of the connected voltage supply nodes.

4. The driver circuit according to the claim 2, wherein the NMOS transistors further include a pair of NMOS transistors in parallel connected to respective voltage supply nodes.

5. The driver circuit according to the claim 4, wherein one of the pair of NMOS transistors is adapted to be activated for charging the output node to a low-level voltage during the read operation of the memory cell and the other one of the pair of NMOS transistors is adapted to be activated for discharging the output node to a ground potential.

6. The driver circuit according to claim 1, wherein the second voltage at the output node is between a ground potential and a supply voltage at the voltage supply node coupled to the second circuit.

7. The driver circuit according to claim 6, wherein a level of the supply voltage at the voltage supply node is a nominal tolerable voltage stress level of the PMOS transistors in the second circuit.

8. The driver circuit according to the claim 1, wherein the third circuit includes one or more transistors for applying one or more gate control voltages to the PMOS transistors based on an external input signal received.

9. The driver circuit according to the claim 8, wherein the third circuit sets the gate control voltages for the PMOS transistors at a ground potential to deliver the second read reference voltage to the output node during the read operation on the memory cell.

10. The driver circuit according to the claim 8, wherein the third circuit is adapted to apply predefined different gate control voltages to deactivate the respective PMOS transistors when the output node is being charged to a high-level voltage through the first circuit.

11. The driver circuit according to the claim 10, wherein the third circuit is adapted to apply a gate control voltage identical to the high level voltage at the output node to the PMOS transistor adjacent to the output node when the output node is being charged to the high level voltage through the first circuit.

12. The driver circuit according to the claim 11, wherein the third circuit is adapted to apply gate control voltages to the respective PMOS transistors, wherein the gate control voltage decreases in magnitude from the high level voltage by a ratio defined by a number of the PMOS transistors.

13. The driver circuit according to the claim 8, wherein the third circuit is adapted to selectively deactivate the PMOS transistors when the output node is being discharged to a ground level through the stacked NMOS transistors in the first circuit.

14. An information processing system that includes at least one memory device, the memory devices including a driver circuit for operating a memory cell, adapted to be coupled to at least one memory cell through a respective output node, said driver circuit including:

a first circuit for supplying the memory cell with a first read reference voltage through the output node;

a second circuit for supplying the memory cell with a second read reference voltage through the output node; and a third circuit for controlling an operation of the second circuit, wherein a range of the second read reference voltage at the output node is wider than a range of the first read reference voltage at the output node during a read operation on the memory cell, wherein the second circuit includes a plurality of PMOS transistors stacked in series between a connected voltage supply node and the output node, each of said PMOS transistors having a gate terminal coupled to a gate control node connected to the third circuit.

15. The information processing system according to the claim 14, wherein the first circuit includes stacked PMOS transistors and stacked NMOS transistors in series in which a common region of a pair of the PMOS and NMOS transistors is connected to the output node coupled to the memory cell;

wherein the PMOS transistors are adapted to provide a high voltage charging path between one of connected voltage supply nodes and the output node for programming or erasing the memory cell; and wherein the NMOS transistors are adapted to provide a high voltage discharging path between the output node and one of the connected voltage supply nodes.

16. The information processing system according to claim 14, wherein the second voltage at the output node is between a ground potential and a supply voltage at the voltage supply node coupled to the second circuit.

17. The information processing system according to the claim 14, wherein the third circuit includes one or more transistors for applying gate control signals to the PMOS transistors in the second circuit based on an external input signal received.

18. The information processing system according to the claim 17, wherein the third circuit sets the gate control voltages of the PMOS transistors at a ground potential to deliver the second voltage at the voltage supply node to the output node during the read operation on the memory cell.

* * * * *